(12) United States Patent
Herr et al.

(10) Patent No.: US 8,270,209 B2
(45) Date of Patent: Sep. 18, 2012

(54) JOSEPHSON MAGNETIC RANDOM ACCESS MEMORY SYSTEM AND METHOD

(75) Inventors: Anna Y. Herr, Ellicott City, MD (US); Quentin P. Herr, Ellicott City, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 329 days.

(21) Appl. No.: 12/771,454

(22) Filed: Apr. 30, 2010

(65) Prior Publication Data

US 2011/0267878 A1 Nov. 3, 2011

(51) Int. Cl.
*G11C 11/44* (2006.01)
(52) U.S. Cl. .................. 365/162; 365/171; 365/189.011; 365/158
(58) Field of Classification Search .................. 365/162, 365/171, 189.011, 158
See application file for complete search history.

(56) References Cited

U.S. PATENT DOCUMENTS

| | | | |
|---|---|---|---|
| 4,916,335 A | 4/1990 | Goto et al. | |
| 5,793,697 A | 8/1998 | Scheuerlein | |
| 5,872,731 A | 2/1999 | Chan et al. | |
| 6,078,517 A | 6/2000 | Herr | |
| 2002/0084453 A1* | 7/2002 | Bozovic | 257/35 |
| 2006/0255987 A1 | 11/2006 | Nagasawa et al. | |
| 2009/0244958 A1 | 10/2009 | Bulzacchelli et al. | |

OTHER PUBLICATIONS

Bell et al.: "*Controllable Josephson Current Through a Pseudospin-Valve Structure*"; Applied Physics Letters, vol. 84, No. 7, Feb. 16, 2004, Downloaded Dec. 11, 2008, 2004 American Institute of Physics, pp. 1153-1155.

International Search Report for corresponding PCT/US11/30311, completed May 20, 2011 by Lee W. Young of the ISA/US.
Maffitt, et al.: "*Design Considerations for MRAM*"; IBM J. Res. & Dev. vol. 50 No. 1, Jan. 2006, Retrieved online on May 20, 2011, retrieved from http://74.125.155.132/scholar?q=cache:zigGVguoY-MJ:scholar.google.com/
+Josephson+MRAM+memory+cell+(array+OR+column+
OR+row)+curerent+direction+(margnitude+OR+amplitude)+
write+read+series+(binary+OR+state+OR+one+OR+zero+OR+%
221%22+OR+%220%22)&hl=en&as_sdt=o.14.
Herr, et al.: "*Towards a 16 Kilobit, Subnanosecond Josephson RAM*"; Supercond. Sci. Techno. 12 (1999) 929-932, PII: S0953-2048(99)04840-X.
http:/www.nitrd.gov/pubs/nsa/sta.pdf "*Superconducting Technology Assessment*", Aug. 2005.
Yoshikawa, et al.: "*Characterization of 4 K CMOS Devices and Circuits for Hybrid Josephson-CMOS Systems*"; IEEE Transactions on Applied Superconductivity, Vo. 15, No. 2, Jun. 2005, pp. 267-271.
Kirichenko, et al.: "*Pipelined DC-Powered SFQ RAM*"; IEEE Transactions on Applied Superconductivity, vol. 11, No. 1, Mar. 2001, pp. 537-540.
Weides, et al.: "*Ferromagnetic 0-π Josephson Junctions*"; arXiv:cond-mat/0701693v2 [cond-mat.supr-con] Apr. 27, 2007, pp. 1-6.

* cited by examiner

*Primary Examiner* — Jason Lappas
(74) *Attorney, Agent, or Firm* — Tarolli, Sundheim, Covell & Tummino LLP

(57) ABSTRACT

One aspect of the present invention includes a Josephson magnetic random access memory (JMRAM) system. The system includes an array of memory cells arranged in rows and columns. Each of the memory cells includes an HMJJD that is configured to store a digital state corresponding to one of a binary logic-1 state and a binary logic-0 state in response to a word-write current that is provided on a word-write line and a bit-write current that is provided on a bit-write line. The HMJJD is also configured to output the respective digital state in response to a word-read current that is provided on a word-read line and a bit-read current that is provided on a bit-read line.

20 Claims, 3 Drawing Sheets

JOSEPHSON MAGNETIC RANDOM ACCESS MEMORY SYSTEM AND METHOD

TECHNICAL FIELD

The present invention relates generally to quantum and classical digital superconducting circuits, and specifically to a Josephson magnetic random access memory (JMRAM) system and method.

BACKGROUND

Superconducting digital technology has provided computing and/or communications resources that benefit from unprecedented high speed, low power dissipation, and low operating temperature. For decades, superconducting digital technology has lacked random-access memory (RAM) with adequate capacity and speed relative to logic circuits. This has been a major obstacle to industrialization for current applications of superconducting technology in telecommunications and signal intelligence, and can be especially forbidding for high-end and quantum computing. All concepts currently considered for superconducting memory have been based on quantization of magnetic flux quanta in a superconducting inductive loop. Such memories can be readily adapted to high speed register files given a foundry process with adequate yield, but can never achieve the integration density of complementary metal-oxide semiconductor (CMOS), as they are fundamentally limited by the size of the inductive loop. One hybrid memory solution has been proposed where the memory core implements CMOS technology and the bit-line detection is done with Josephson devices. However, such a configuration yields only nominally higher performance than standard CMOS and suffers from relatively high power dissipation for a cryogenic environment.

SUMMARY

One aspect of the present invention includes a Josephson magnetic random access memory (JMRAM) system. The system includes an array of memory cells arranged in rows and columns. Each of the memory cells includes a hysteretic magnetic Josephson junction device (HMJJD) that is configured to store a digital state corresponding to one of a binary logic-1 state and a binary logic-0 state in response to a word-write current that is provided on a word-write line and a bit-write current that is provided on a bit-write line. The HMJJD is also configured to output the respective digital state in response to a word-read current that is provided on a word-read line and a bit-read current that is provided on a bit-read line.

Another aspect of the present invention includes a method for reading a JMRAM. The method includes generating a word-read current on a word-line to select a respective one of a plurality of rows of an array of memory cells. Each of the memory cells can include an HMJJD that is configured to store a digital state. The method also includes generating a bit-read current on a bit-line associated with each of a plurality of columns of the array of memory cells. The method also includes reading the digital state from each of the memory cells in the respective one of the plurality of rows based on triggering each HMJJD in the memory cells in the respective one of the plurality of rows that stores one of a binary logic-1 state and a binary logic-0 state in response to the word-read current and the bit-read current associated with each of the plurality of columns of the array of memory cells.

Another aspect of the present invention includes a memory array. The memory array includes a plurality of word-write lines each configured to conduct a respective word-write current that selects a given row of memory cells during a data write operation. Each of the memory cells includes an HMJJD. The memory array also includes a plurality of bit-write lines each configured to conduct a respective bit-write current to write a digital state corresponding to one of a binary logic-0 state and a binary logic-1 state into the HMJJD associated with each memory cell of the given row of memory cells. The HMJJD can be magnetically coupled to a respective one of the plurality of word-write lines and a respective one of the plurality of bit-write lines. The memory array also includes a plurality of word-read lines each configured to conduct a respective word-read current that selects a given row of memory cells during a data read operation. The memory array further includes a plurality of bit-read lines each configured to conduct a respective bit-read current, the HMJJD providing an indication of the stored digital state in response to the word-read current and the bit-read current during the data read operation.

DETAILED DESCRIPTION

The present invention relates generally to quantum and classical digital superconducting circuits, and specifically to a Josephson magnetic random access memory (JMRAM) system and method. The JMRAM system can implement an array of memory cells that each include a hysteretic magnetic Josephson junction device (HMJJD) that includes one or more hysteretic magnetic Josephson junctions, such as one or more Josephson junctions with ferromagnetic materials in the associated barrier. As an example, the HMJJD can be arranged as a superconducting quantum interface device (SQUID). The HMJJD can be configured to store a digital state corresponding to one of a binary logic-1 state or a binary logic-0 state in response to a word-write current and a bit-write current associated with the HMJJD. As an example, the word-write and bit-write currents can each be provided on dedicated word-write and bit-write lines, and can set the logic state of the HMJJD based on respective current flow directions relative to each other.

In addition, the HMJJD of each of the memory cells of the array can provide an indication of the stored digital state in response to a word-read current and a bit-read current. As an example, the word-read current can be provided on a word-read line to lower a critical current associated with the HMJJD of each of the memory cells of a row of the array, and the bit-read current can bias the HMJJD to trigger the Josephson junctions to change a voltage on the associated bit-read line based on the HMJJD storing a digital state corresponding to a binary logic-1 state and not triggering based on the HMJJD storing a digital state corresponding to a binary logic-0 state. Thus, the HMJJD can provide a voltage having a magnitude that varies based on whether the digital states of the HMJJD correspond to the binary logic-1 state or the binary logic-0 state.

Figure 1:
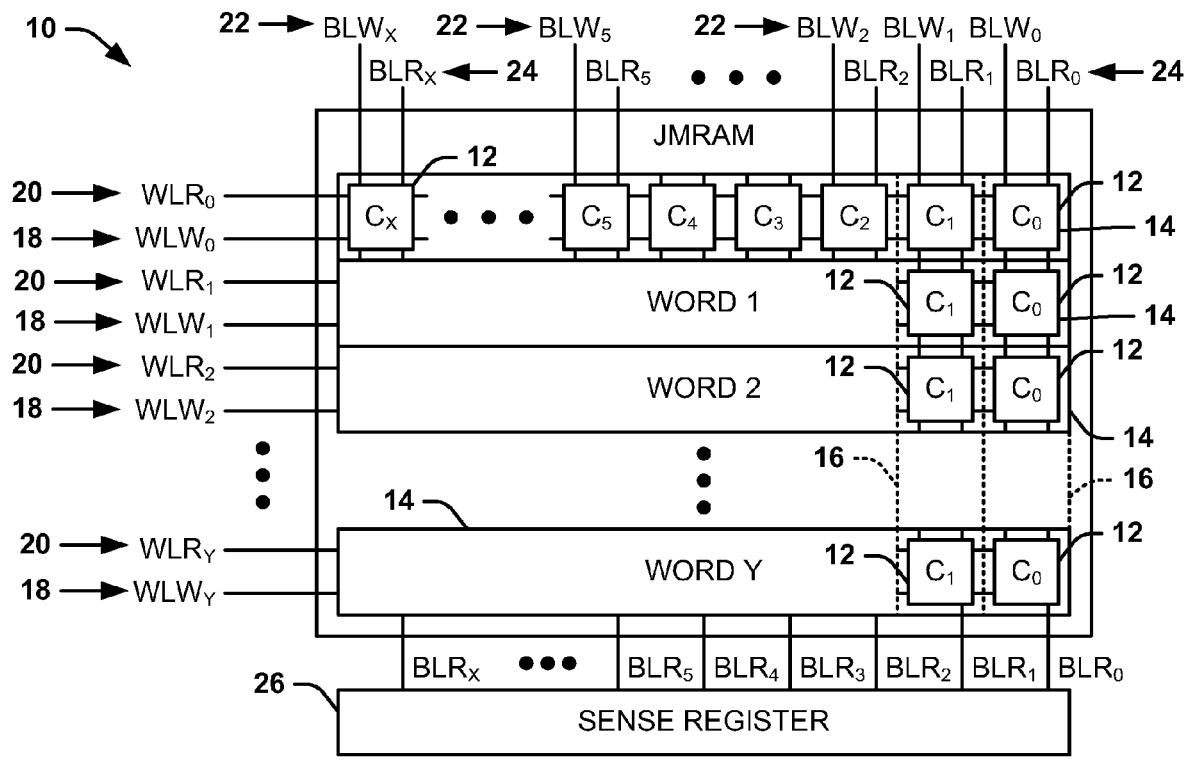
FIG. 1 illustrates an example of a Josephson magnetic random access memory (JMRAM) system in accordance with an aspect of the invention.

FIG. 1 illustrates an example of a Josephson magnetic random access memory (JMRAM) system 10 in accordance with an aspect of the invention. The JMRAM system 10 can be implemented as a memory structure in a variety of quantum and/or classical computing applications. As an example, the JMRAM system 10 can be configured cryogenically in a quantum computing circuit, such as operating at approximately 4 degrees Kelvin or less, to store data in a quantum computing environment.

The JMRAM system 10 is demonstrated in the example of FIG. 1 as being arranged as an array of memory cells 12. Specifically, the memory cells 12 are arranged in rows 14 that each correspond to a data word, demonstrated as WORD 0 through WORD Y, where Y is an integer greater than 1. Each of the rows 14 includes a set of memory cells 12 that form X columns 16 across the rows 14, with the memory cells 12 in WORD 0 being demonstrated in the example of FIG. 1 as $C_0$ to $C_X$, where X is an integer greater than 1. Therefore, each of the memory cells 12 in the array of the JMRAM system 10 can be individually addressable by row 14 and column 16.

In the example of FIG. 1, each of the rows 14 is demonstrated as having an associated word-write line 18 and word-read line 20, demonstrated as $WLW_0$ and $WLR_0$ through $WLW_Y$ and $WLR_Y$, respectively. The word-write line 18 and word-read line 20 can be inductively and/or magnetically coupled to each of the memory cells 12 in each of the rows 14 of the JMRAM system 10. In addition, each of the memory cells 12 is demonstrated as having an associated bit-write line 22 and bit-read line 24, demonstrated as $BLW_0$ and $BLR_0$ through $BLW_Y$ and $BLR_Y$, respectively. The bit-write line 22 and bit-read line 24 can be coupled to each corresponding numbered memory cell 12 in each of the rows 14 of the JMRAM system 10, such that the memory cells 12 in each column 16 are arranged in series with respect to the bit-write line 22 and bit-read line 24.

Each of the memory cells 12 is configured to store a single bit of data. Specifically, each of the memory cells 12 can include at least one hysteretic magnetic Josephson junction that can be configured to store a digital state corresponding to a binary logic-1 or a binary logic-0. The digital state can be set in response to a word-write current that is provided on the respective word-write line 18 and a bit-write current that is provided on the respective bit-write line 22. Similarly, the respective digital state that is stored in each of the memory cells 12 can be read from the memory cells 12 based on a word-read current that is provided on the respective word-read line 20 to select a given one of the rows 14 and a bit-read current that is provided on the respective bit-read line 24. Specifically, the bit-read line 24 of each of the columns 16 is coupled to a sense register 26 that is configured to measure the respective bit-read line 24 to determine whether digital state of each of the memory cells 12 of an associated row 14 correspond to a binary logic-1 state or a binary logic-0 state in response to the word-read current and the bit-read current during a data read operation. As an example, the sense register 26 can measure a voltage or a current associated with the bit-read line 24, as described in greater detail below.

Figure 2:
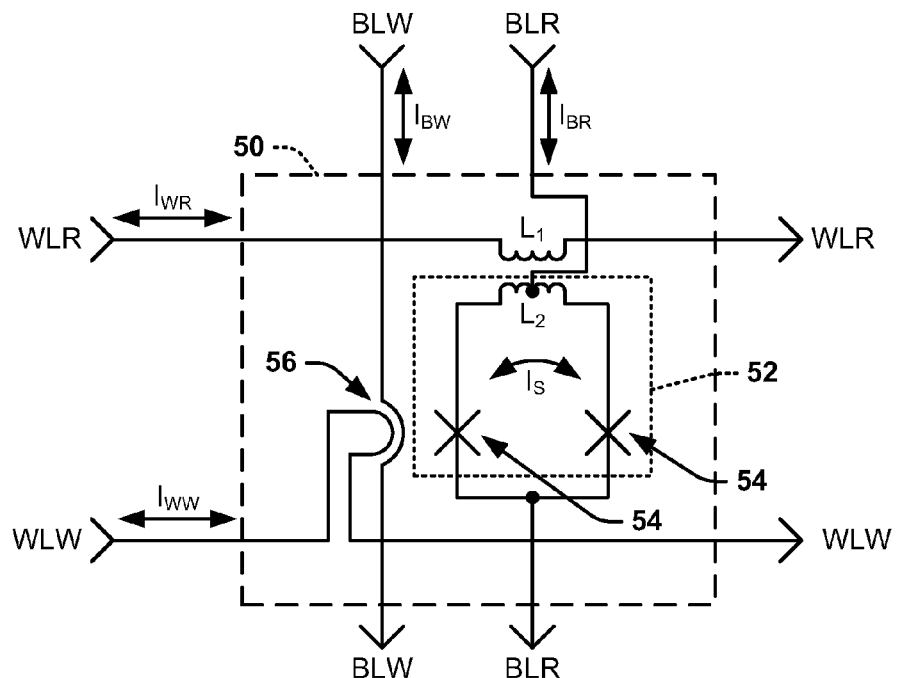
FIG. 2 illustrates an example of a memory cell in accordance with an aspect of the invention.

FIG. 2 illustrates an example of a memory cell system 50 in accordance with an aspect of the invention. The memory cell system 50 can correspond to one of the memory cells 12 in the example of FIG. 1. Therefore, reference is to be made to the JMRAM system 10 in the example of FIG. 1 in the following description of the example of FIG. 2.

The memory cell system 50 includes a word-write line WLW and a word-read line WLR that each pass through the memory cell system 50. The word-write line WLW conducts a word-write current $I_{WW}$ during a data write operation and the word-read line WLR conducts a word-read current $I_{WR}$ during a data read operation. Similarly, the memory cell system 50 includes a bit-write line BLW and a bit-read line BLR that each pass through the memory cell system 50. The bit-write line BLW conducts a bit-write current $I_{BW}$ during the data write operation and the bit-read line BLR conducts a bit-read current $I_{BR}$ during the data read operation. As an example, the word-write and word-read lines WLW and WLR can likewise be coupled to adjacent memory cells in a given row on either side of the memory cell system 50. Thus, the word-read and word-write currents $I_{WW}$ and $I_{WR}$ flow through all of the memory cell systems in the row, including the memory cell system 50, during the respective data write and data read operations. In a similar manner, the bit-write and bit-read lines BLW and BLR can likewise be coupled to adjacent memory cells in a given column above and below the memory cell system 50. Thus, the bit-read and bit-write currents $I_{BW}$ and $I_{BR}$ flow through all of the memory cell systems in the column, including the memory cell system 50, during the respective data write and data read operations.

The memory cell system 50 also includes a hysteretic magnetic Josephson junction device (HMJJD) 52 that is configured to store a digital state corresponding to one of the binary logic-1 state or the binary logic-0 state. In the example of FIG. 2, the HMJJD 52 is demonstrated as a pair of Josephson junctions 54 with ferromagnetic materials in the associated barriers arranged as a superconducting quantum interface device (SQUID). Specifically, the Josephson junctions 54 are demonstrated in a superconducting loop with an inductor $L_2$. As an example, the Josephson junctions 54 can be configured as superconductor-ferromagnetic-superconductor (SFS) Josephson junctions. The HMJJD 52 can include outer layers of superconducting material, such as Niobium (Nb), and one or more internal thin film layers of ferromagnetic materials between the pair of Josephson junctions 54. As an example, the thin film layers of ferromagnetic materials can include one or more "hard" ferromagnetic layers having a substantially fixed magnetic field and one or more "soft" ferromagnetic layers that can be changed as a result of magnetic fields generated locally by orthogonal electrical currents. The bit-read line BLR and/or the word-read line WLR can be fabricated from superconducting materials, such that the bit-read line BLR and/or the word-read line WLR form the superconducting outer layers of the HMJJD 52. Furthermore, the HMJJD 52 can include one or more additional layers, such as oxide layers, that are interleaved with the superconducting and/or ferromagnetic layers.

In the example of FIG. 2, the word-write line WLW and the bit-write line BLW are demonstrated as magnetically coupled to the HMJJD 52, as indicated at 56. As an example, the HMJJD 52 can include two or more different ferromagnetic layers, and the orientation of the magnetic field in one of the ferromagnetic layers is substantially fixed. The magnetic field orientation of the other one or more ferromagnetic layers can be changed as a result of magnetic fields that are generated locally by the word-write current $I_{WW}$ and the bit-write current $I_{BW}$.

Therefore, based on the configuration of the HMJJD 52, the word-write current $I_{WW}$ and the bit-write current $I_{BW}$ can generate the magnetic field to set the digital state of the HMJJD 52 to a binary logic-1 state or a binary logic-0 state using magneto-current states of the HMJJD 52 based on the respective directions of current flow during a data write operation. Specifically, if the combined magnetic field produced by the word-write current $I_{WW}$ and the bit-write current $I_{BW}$ has the same orientation as the internal magnetic field of the hard ferromagnetic layers, the individual magnetic fields of each of the word-write current $I_{WW}$ and the bit-write current $I_{BW}$ can add together positively or negatively to set the digital state of the hysteretic magnetic Josephson junction to correspond to a binary logic-1 state or a binary logic-0 state respectively. However, if the combined magnetic field produced by the word-write current $I_{WW}$ and the bit-write current $I_{BW}$ has the opposite orientation as the internal magnetic field of the hard ferromagnetic layers, the digital state of the HMJJD 52 remains unchanged.

Similarly, the individual magnetic field of only one of the word-write current $I_{WW}$ and the bit-write current $I_{BW}$ may be insufficient to change the digital state of the HMJJD 52, such that memory cells in unaddressed rows maintain their respective digital states despite the flow of the bit-write current $I_{BW}$. Furthermore, based on the superconductivity of the word-write line WLW and the bit-write line BLW and the presence of a superconducting ground plane, cross coupling between the word-write line WLW and the bit-write line BLW can be substantially mitigated. Therefore, for a given current-flow direction of the word-write current $I_{WW}$ in a given row, the current-flow directions of the respective bit-write currents $I_{BW}$ in each of the columns can be controlled to set the digital state of each of the HMJJDs 52 in a given row during a data write operation without affecting the digital states in any of the memory cells in any of the other rows through which a word-write current $I_{WW}$ is not provided.

The digital state of the HMJDD 52 can be read from the memory cell system 50 in response to the word-read current $I_{WR}$ and the bit-read current $I_{BR}$. Specifically, the word-read current $I_{WR}$ can be provided on the word-read line WLR to select the row of memory cells in the associated memory array. The word-read line WLR is demonstrated in the example of FIG. 2 as including a discrete inductor $L_1$. Therefore, the word-read current $I_{WR}$ flows through the discrete inductor $L_1$ as a DC current pulse. The discrete inductor $L_1$ is inductively coupled to the discrete inductor $L_2$ that is included in the HMJJD 52. Thus, the word-read current $I_{WR}$ induces a DC current pulse in the HMJJD 52. It is to be understood that the discrete inductors $L_1$ and $L_2$ may, in the example of FIG. 2, be representative of inherent inductive properties of the arrangement of the layers of the HMJJD 52, and thus may not be configured as actual inductors.

The bit-read current $I_{BR}$ is provided directly to the HMJJD 52, thus flowing substantially equally through each of the Josephson junctions 54. In addition, the current induced by the word-read current $I_{WR}$ via the discrete inductors $L_1$ and $L_2$ is added to bit-read current $I_{BR}$ through one of the Josephson junctions 54 based on the direction of current flow of the word-read current $I_{WR}$. Because the current induced by the word-read current $I_{WR}$ is added to the bit-read current through one of the Josephson junctions 54, the word-read current $I_{WR}$ essentially suppresses a critical current of the HMJJD 52, with the magnitude of the critical current corresponding to the current necessary to trigger the HMJJD 52. The current induced by the word-read current $I_{WR}$ and the bit-read current $I_{BR}$ are thus demonstrated collectively as a sense current $I_S$ within the HMJJD 52.

The critical current of the HMJJD 52 may be further affected by the digital state of the HMJJD 52. Specifically, the critical current can be reduced significantly when the HMJJD 52 stores a binary logic-1 state rather than a binary logic-0 state. As an example, the HMJJD 52 can have a critical current of approximately 100 micro-amps ($\mu A$) when storing a binary logic-1 state and a critical current of approximately 300 $\mu A$ when storing a binary logic-0 state. In addition, when the memory cell system 50 is selected to be read by the word-read current $I_{WR}$, the critical current of the HMJJD 52 can be further reduced down to approximately 60 $\mu A$. Therefore, the bit-read current $I_{BR}$ can have a magnitude that is between the critical currents corresponding to the binary logic-1 state when the memory cell system 50 is selected by the word-read current $I_{WR}$ (e.g., 60 $\mu A$) and when the memory cell system 50 is unselected by the word-read current $I_{WR}$ (e.g., 100 $\mu A$), such as approximately 80 $\mu A$. Accordingly, the magnitude of the bit-read current $I_{BR}$ is selected to trigger the HMJJD 52 only when the HMJJD 52 stores the binary logic-1 state. As an example, when the HMJJD 52 triggers, one of the Josephson junctions 54 having the aggregate current of the bit-read current $I_{BR}$ and the current induced by the word-read current $I_{WR}$ can trigger first, followed by the other Josephson junction 54 in an oscillatory manner. As a result, when the HMJJD 52 triggers, the HMJJD 52 emits a voltage on the bit-read line BLR that is indicative of the stored binary logic-1 state.

The digital state of the HMJDD 52 of the memory cell system 50 can be read in a variety of other ways. As an example, the digital state of the HMJDD 52 of the memory cell system 50 can be read based on changes in resistance of the Josephson junctions 54. Specifically, the resistance of the barriers of the HMJDD 52 can have a resistance that is hysteretic, such that it varies based on the stored digital state. Thus, the bit-read current $I_{BR}$ can have a magnitude that is set to trigger the Josephson junctions 54 of the HMJDD 52. As a result, the voltage of the bit-read line BLR can be measured, such as by the sense register 26 in the example of FIG. 1, such that the voltage of the bit-read line BLR can be indicative of the digital state stored in the HMJDD 52.

It is to be understood that the memory cell system 50 is not intended to be limited to the example of FIG. 2. As an example, the memory cell system 50 is demonstrated diagrammatically, such that the arrangement of the word-lines WLR and WLW and the bit-lines BLR and BLW with respect to each other and to the HMJJD 52 can vary. For example, the configuration of the word-write line WLW and the bit-write line BLW can be such that the direction of current flow of the word-write current $I_{WW}$ and the bit-write current $I_{BW}$ can be opposite to store the digital state in the HMJJD 52. In addition, the memory cell system 50 is not limited to implementing a pair of Josephson junctions as the HMJJD 52, but could instead implement a single Josephson junction or could be configured as a variety of other types of HMJJDs. Furthermore, although the example of FIG. 2 describes that the word-lines WLR and WLW and the bit-lines BLR and BLW are arranged in series with other adjacent memory cells in the respective row and column, the word-lines WLR and WLW and the bit-lines BLR and BLW could instead be dedicated with respect to the memory cell system 50. Accordingly, the memory cell system 50 can be configured in a variety of ways.

Figure 3:
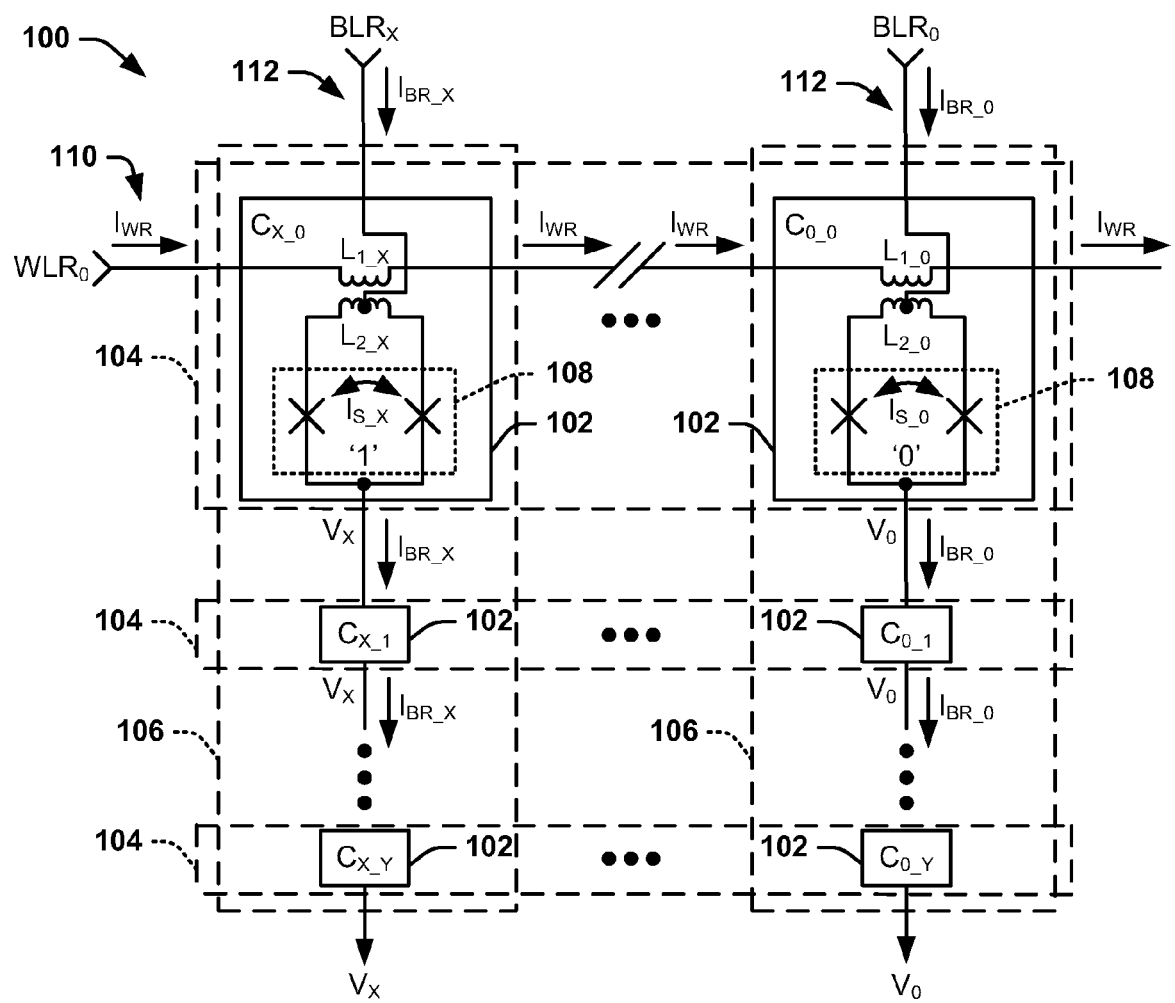
FIG. 3 illustrates another example of a JMRAM system in accordance with an aspect of the invention.

FIG. 3 illustrates another example of a JMRAM system 100 in accordance with an aspect of the invention. The JMRAM system 100 can be configured similar to the JMRAM system 100 in the example of FIG. 1. Thus, reference is to be made to the example of FIG. 1 in the following description of the example of FIG. 3. Specifically, the example of FIG. 3 demonstrates a data read operation in which data is read from the JMRAM system 100.

The JMRAM system 100 is demonstrated in the example of FIG. 3 as being arranged as an array of memory cells 102. Specifically, the memory cells 102 are arranged in rows 104 that each correspond to a data word 0 through Y, where Y is an integer greater than 1. Each of the rows 104 includes a set of memory cells 102 that form X columns 106 across the rows 104, where X is an integer greater than 1. In the example of FIG. 3, each of the demonstrated memory cells 102 is designated by column and row, from $C_{0\_0}$ to $C_{X\_Y}$.

In the example of FIG. 3, the memory cells 102 corresponding to memory cells $C_{0\_0}$ and $C_{X\_0}$ are demonstrated in greater detail. Specifically, similar to the memory cell system 50 in the example of FIG. 2, the memory cells $C_{0\_0}$ and $C_{X\_0}$ include first and second discrete inductors $L_{1\_0}$ and $L_{2\_0}$ and $L_{1\_X}$ and $L_{2\_X}$, respectively. The memory cells $C_{0\_0}$ and $C_{X\_0}$ also each include an HMJJD 108, which can each include a pair of Josephson junctions. It is to be understood that the memory cells $C_{0\_0}$ and $C_{X\_0}$ can also include word-write and bit-write lines, similar to as demonstrated in the example of FIG. 2, but have been omitted from the example of FIG. 3 for brevity.

The JMRAM system 100 also includes a word-read line 110, demonstrated as $WLR_0$, thus corresponding to the $0^{th}$ row 104, which passes through the discrete inductors $L_{1\_X}$ and $L_{1\_0}$ of the memory cells $C_{0\_0}$ and $C_{X\_0}$, respectively. The JMRAM system 100 also includes bit-read lines 112, demonstrated as $BLR_X$ and $BLR_0$, thus corresponding to the $X^{th}$ and $0^{th}$ columns 106, respectively. The bit-read lines 112 are demonstrated as coupled to the HMJJDs 108. It is to be understood that, while the example of FIG. 3 only demonstrates the word-read line $WLR_0$ and the bit-read lines $BLR_X$ and $BLR_0$, the JMRAM system 100 also includes additional word-read lines 110 for each of the rows 104 and additional bit-read lines 112 for each of the columns 112.

The word-read line $WLR_0$ conducts a DC word-read current pulse $I_{WR}$ that passes through the $0^{th}$ row 104, including the memory cells $C_{X\_0}$ and $C_{0\_0}$ which selects the $0^{th}$ row 104 for reading. As a result, the word-read current $I_{WR}$ induces a DC current pulse via the first and second discrete inductors $L_{1\_X}$ and $L_{2\_X}$ and $L_{1\_0}$ and $L_{2\_0}$, respectively, that suppresses a critical current of the HMJJD 108. In addition, the bit-read lines $BLR_X$ and $BLR_0$ conduct bit-read currents $I_{BR\_X}$ and $I_{BR\_0}$, respectively, that pass through the $X^{th}$ and $0^{th}$ columns 106, including the memory cells $C_{X\_0}$ and $C_{0\_0}$. The current induced in the HMJJDs 108 by the word-read current $I_{WR}$ and the bit-read currents $I_{BR\_X}$ and $I_{BR\_0}$ are demonstrated collectively in the HMJJDs 108 as sense currents $I_{S\_X}$ and $I_{S\_0}$, respectively.

In the example of FIG. 3, the HMJJD 108 that is associated with the memory cell $C_{X\_0}$ is demonstrated as storing a binary logic-1 state ('1') and the HMJJD 108 that is associated with the memory cell $C_{0\_0}$ is demonstrated as storing a binary logic-0 state ('0'). The digital states of the memory cells $C_{X\_0}$ and $C_{0\_0}$, as well as the remaining memory cells 102 in the $0^{th}$ row 104, could have been set in a previously performed data write operation. Similar to as described above in the example of FIG. 2, the critical current of the HMJJDs 108 can depend on whether the HMJJDs 108 store a binary logic-1 state or a binary logic-0 state. Thus, by storing the binary logic-1 state, the HMJJD 108 associated with the memory cell $C_{X\_0}$ can have a critical current when selected by the word-read current $I_{WR}$ (e.g., approximately 60 µA) that is less than the critical current of the memory cell $C_{0\_0}$ that stores the binary logic-0 state (e.g., approximately 300 µA). Therefore, the bit-read currents $I_{BR\_X}$ and $I_{BR\_0}$ can each have a magnitude (e.g., approximately 80 µA) that is between the critical currents corresponding to the binary logic-1 state when selected by the word-read current $I_{WR}$ and when unselected by the word-read current $I_{WR}$ (e.g., 100 µA), such as approximately 80 µA.

Based on the magnitude of the bit-read currents $I_{BR\_X}$ and $I_{BR\_0}$ relative to the critical currents of the HMJJDs 108 of the memory cells $C_{X\_0}$ and $C_{0\_0}$, the HMJJD 108 of the memory cell $C_{X\_0}$ triggers and the memory cell $C_{0\_0}$ does not trigger.

During the data read operation, a sense register (not shown), such as the sense register 26 in the example of FIG. 1, can monitor a voltage $V_X$ associated with the bit-read line $BLR_X$ and a voltage $V_0$ associated with the bit-read line $BLR_0$. For example, the sense register can compare the voltages $V_X$ and $V_0$ with a threshold, such as to perform differential voltage sensing.

The HMJJD 108, upon triggering, can provide a voltage pulse. As an example, the voltage pulse can be emitted in a direction opposite the flow of the bit-read current $I_{BR\_X}$. Thus, the voltage $V_X$ can have a magnitude that is less than the voltage $V_0$. Accordingly, in the example of FIG. 3, the lesser magnitude of the voltage $V_X$ and the greater magnitude of the voltage $V_0$, such as relative to a threshold magnitude, can indicate that the memory cell $C_{X\_0}$ stores a binary logic-1 state and the memory cell $C_{0\_0}$ stores a binary logic-0 state. As another example, based on the superconductivity of the bit-read line BLR, the associated sense register can be configured to measure a magnitude of the bit-read currents $I_{BR\_X}$ and $I_{BR\_0}$ to determine the digital state of the respective memory cells $C_{X\_0}$ and $C_{0\_0}$. It is to be understood that, while the example of FIG. 3 focuses on the $X^{th}$ and $0^{th}$ columns 106, bit-read currents can be provided for all of the columns 106 therebetween, such that associated voltages on the respective bit-read lines 112 can be monitored in a similar manner. Accordingly, the entire data word associated with the $0^{th}$ row 104 can be concurrently read during the data read operation. In this manner, the memory cells 102 in any of the rows 104 can be read during the data read operation, as described in the example of FIG. 3.

Figure 4:
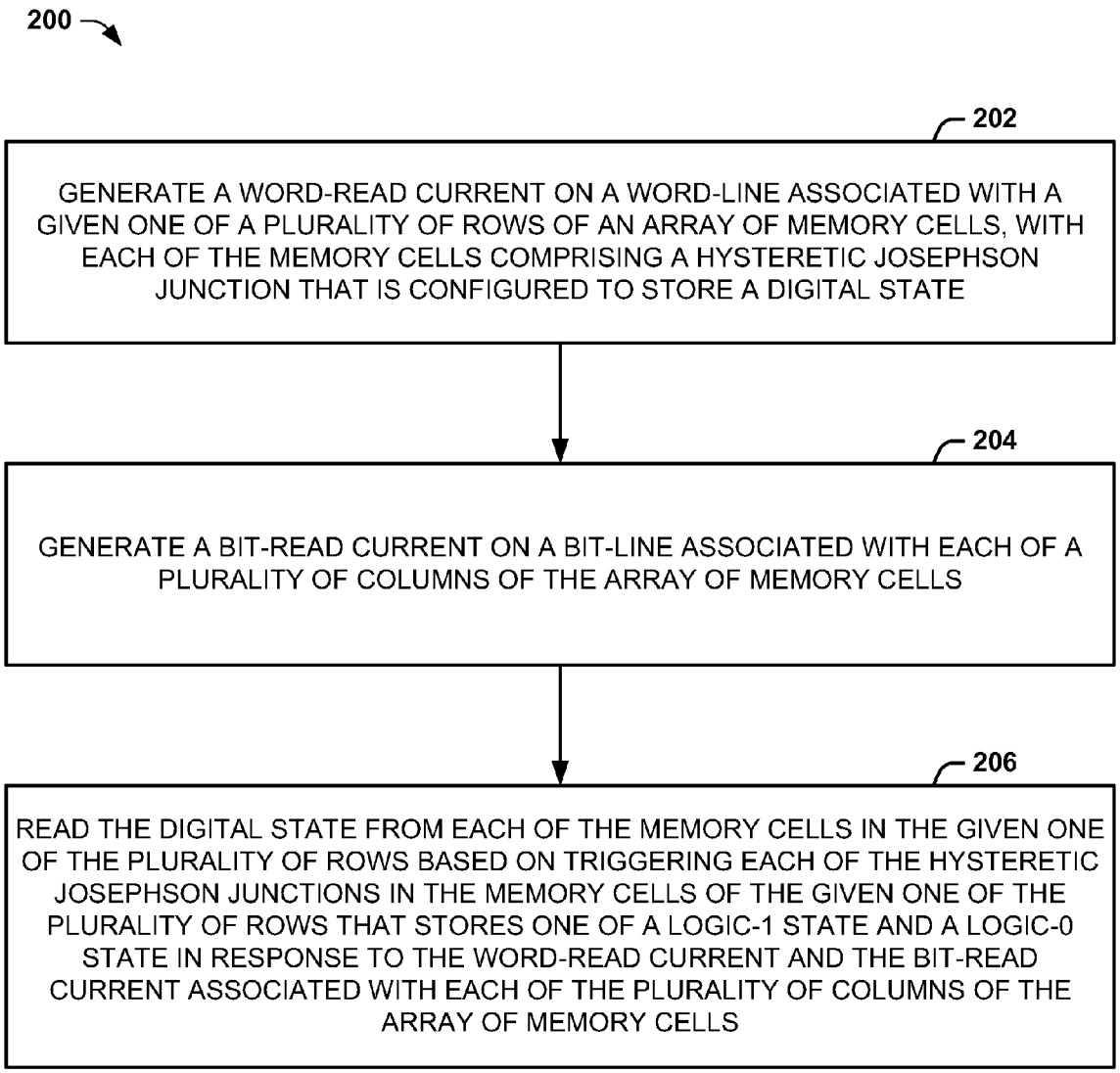
FIG. 4 illustrates an example of a method for reading a JMRAM in accordance with an aspect of the invention.

In view of the foregoing structural and functional features described above, a methodology in accordance with various aspects of the present invention will be better appreciated with reference to FIG. 4. While, for purposes of simplicity of explanation, the methodology of FIG. 4 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 4 illustrates an example of a method 200 for reading a JMRAM in accordance with an aspect of the invention. At 202, a word-read current is generated on a word-line associated with a given one of a plurality of rows of an array of memory cells, with each of the memory cells comprising a hysteretic magnetic Josephson junction that is configured to store a digital state. The hysteretic magnetic Josephson junction can be a Josephson junction that can store the digital state in response to a word-write current on a word-write line and a bit-write current on a bit-write line. At 204, a bit-read current is generated on a bit-line associated with each of a plurality of columns of the array of memory cells. Each of the bit-read currents can have approximately the same magnitude.

At 206, the digital state is read from each of the memory cells in the given one of the plurality of rows based on triggering the hysteretic magnetic Josephson junction in each of the memory cells in the given one of the plurality of rows that stores one of a binary logic-1 state and a binary logic-0 state in response to the word-read current and the bit-read current associated with each of the plurality of columns of the array of memory cells. The word-read current may suppress the critical current of the hysteretic magnetic Josephson junctions, and the hysteretic magnetic Josephson junctions may have a critical current that is based on the stored digital state. Thus, the bit-read current may have a magnitude that is selected to trigger only the hysteretic magnetic Josephson junctions that have the one of the binary logic-1 and binary logic-0 states.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A Josephson magnetic random access memory (JMRAM) system comprising an array of memory cells arranged in rows and columns, each of the memory cells comprising a hysteretic magnetic Josephson junction device (HMJJD) that is configured to store a digital state corresponding to one of a binary logic-1 state and a binary logic-0 state in response to a word-write current that is provided on a word-write line and a bit-write current that is provided on a bit-write line, the HMJJD also being configured to output the respective digital state in response to a word-read current that is provided on a word-read line and a bit-read current that is provided on a bit-read line.

2. The JMRAM of claim 1, wherein the word-write line and the word-read line are common to each of the memory cells in a given row of the array, and wherein the bit-write line and the bit-read line are common to each of the memory cells in a given column of the array, such that the array of memory cells are arranged in series with respect to each of the rows and each of the columns of the array.

3. The JMRAM of claim 1, wherein each of the word-write line and the bit-write line associated with a given memory cell are magnetically coupled to the HMJJD, wherein the word-write current is provided on the word-write line through each of the memory cells in a given one of the rows during a data write operation, and wherein the bit-write line comprises a plurality of bit-write lines that are each associated with a respective one of the columns, each of a respective plurality of bit-write currents having a current direction that corresponds to storage of one of the binary logic-1 state and the binary logic-0 state in each of the memory cells in the given one of the rows.

4. The JMRAM of claim 1, wherein the bit-read line comprises a plurality of bit-read lines that are each associated with a respective one of the columns, each of a respective plurality of bit-read currents being provided to the HMJJD associated with each of the respective memory cells in a given one of the rows that is selected in response to the word-read current being provided during a data read operation to provide an indication of the stored digital state of each of the HMJJDs in the given one of the rows on the plurality of bit-read lines.

5. The JMRAM of claim 4, wherein the word-read current and the plurality of bit-read currents cooperate to trigger each HMJJD of the memory cells in the given one of the rows that stores the digital state associated with one of the binary logic-0 state and the binary logic-1 state, the indication of the stored digital state being associated with a voltage of the plurality of bit-read lines.

6. The JMRAM of claim 5, wherein at least a portion of the word-read current is added to the bit-read current in each of the memory cells to generate a sense current, each HMJJD of the memory cells in the given one of the rows being triggered based on a magnitude of the sense current relative to a critical current associated with the HMJJD.

7. The JMRAM of claim 4, wherein the HMJJD in each of the memory cells has an associated critical current having a first magnitude corresponding to the binary logic-1 state when the given one of the rows is selected by the word-read current, a second magnitude corresponding to the binary logic-1 state when the given one of the rows is not selected by the word-read current, the second magnitude being greater than the first magnitude, and a third magnitude corresponding to the binary logic-0 state, the third magnitude being greater than the second magnitude, and wherein the bit-read current has a magnitude that is between the first magnitude and the second magnitude, such that the bit-read current triggers the HMJJD in each of the memory cells in the given one of the rows associated with the binary logic-1 state.

8. The JMRAM of claim 4, wherein the of plurality of bit-read currents has a current magnitude sufficient to trigger the HMJJD associated with each of the respective memory cells in a given one of the rows through which the word-read current is provided during a data read operation to provide an indication of the stored digital state of each of the HMJJDs in the given one of the rows on the plurality of bit-read lines based on the HMJJD having a resistance that varies based on the stored digital state.

9. The JMRAM of claim 1, wherein the HMJJD comprises at least one magnetic Josephson junction.

10. The JMRAM of claim 9, wherein the at least one magnetic Josephson junction comprises a pair of parallel magnetic Josephson junctions, the HMJJD further comprising a discrete inductor interconnecting the pair of parallel magnetic Josephson junctions and directly coupled to the bit-read line, the discrete inductor being inductively coupled to the word-read line to induce a current in the HMJJD in response to the word-read current.

11. A method for reading a Josephson magnetic random access memory (JMRAM), the method comprising:
generating a word-read current on a word-line to select a respective one of a plurality of rows of an array of memory cells, each of the memory cells comprising a hysteretic magnetic Josephson junction device (HMJJD) that is configured to store a digital state;
generating a bit-read current on a bit-line associated with each of a plurality of columns of the array of memory cells; and
reading the digital state from each of the memory cells in the respective one of the plurality of rows based on triggering each HMJJD in the memory cells in the respective one of the plurality of rows that stores one of a binary logic-1 state and a binary logic-0 state in response to the word-read current and the bit-read current associated with each of the plurality of columns of the array of memory cells.

12. The method of claim 11, wherein reading the digital state comprises measuring one of a voltage and a current of the bit-line associated with each of the plurality of columns of an array of memory cells, a magnitude of the one of the voltage and the current being indicative of whether the HMJJD of the memory cells in the respective one of the plurality of rows triggered in response to the word-read current and the bit-read current associated with each of the plurality of columns of the array of memory cells.

13. The method of claim 11, wherein generating the word-read current comprises providing the word-read current on the word-read line in each of the memory cells in the respective one of the plurality of rows in series, and wherein generating the bit-read current comprises providing the bit-read current on the bit-read line through each of the memory cells in each of the memory cells in each of the plurality of columns in series.

14. The method of claim 11, wherein generating the bit-read current comprises generating the bit-read current at a magnitude that is greater than a first critical current magnitude associated with the HMJJD of each of the memory cells in the respective one of the plurality of rows having the binary logic-1 state and at a magnitude that is less than a second critical current associated with the HMJJD of each of the memory cells not in the respective one of the plurality of rows having the binary logic-1 state and that is less than a third critical current magnitude associated with the HMJJD of each of the memory cells in the respective one of the plurality of rows having the binary logic-0 state.

15. The method of claim 11, further comprising:
providing the word-read current to induce a current in the HMJJD associated with each of the memory cells in the respective one of the plurality of rows via a discrete inductor that is inductively coupled to the word-read line;
generating a sense current that is a sum of the current and the bit-read current in the HMJJD; and
triggering the HMJJD upon the sense current exceeding a critical current associated with the HMJJD, the critical current having a magnitude that is based on the digital state stored in the HMJJD.

16. A Josephson magnetic random access memory (JMRAM) array comprising:
a plurality of word-write lines each configured to conduct a respective word-write current that selects a given row of memory cells during a data write operation, the memory cells each comprising a hysteretic magnetic Josephson junction device (HMJJD);
a plurality of bit-write lines each configured to conduct a respective bit-write current to write a digital state corresponding to one of a binary logic-0 state and a binary logic-1 state into the HMJJD associated with each memory cell of the given row of memory cells, the HMJJD being magnetically coupled to a respective one of the plurality of word-write lines and a respective one of the plurality of bit-write lines;
a plurality of word-read lines each configured to conduct a respective word-read current that selects a given row of memory cells during a data read operation; and
a plurality of bit-read lines each configured to conduct a respective bit-read current, the HMJJD providing an indication of the stored digital state in response to the word-read current and the bit-read current during the data read operation.

17. The JMRAM array of claim 16, wherein the respective bit-read and the word-read currents are configured to trigger the HMJJD to provide an output voltage based on the HMJJD storing the binary logic-1 state.

18. The JMRAM array of claim 16, wherein the HMJJD has an associated critical current having a first magnitude corresponding to the binary logic-1 state when the given one of the rows is selected by the word-read current, a second magnitude corresponding to the binary logic-1 state when the given one of the rows is not selected by the word-read current, the second magnitude being greater than the first magnitude, and a third magnitude corresponding to the binary logic-0 state, the third magnitude being greater than the second magnitude, and wherein the bit-read current has a magnitude that is between the first magnitude and the second magnitude, such that the bit-read current triggers the HMJJD in each of the memory cells in the given one of the rows associated with the binary logic-1 state.

19. The JMRAM array of claim 16, wherein the HMJJD comprises at least one magnetic Josephson junction.

20. The JMRAM array of claim 19, wherein the at least one magnetic Josephson junction comprises a pair of parallel magnetic Josephson junctions, the HMJJD further comprising a discrete inductor interconnecting the pair of parallel magnetic Josephson junctions and directly coupled to a respective one of the plurality of bit-read lines, the discrete inductor being inductively coupled to a respective one of the plurality of word-read lines to induce a current in the HMJJD in response to the respective word-read current.

* * * * *